(12) United States Patent
Mimura et al.

(10) Patent No.: US 6,311,436 B1
(45) Date of Patent: *Nov. 6, 2001

(54) SOLAR ROOF MEMBER

(75) Inventors: Toshihiko Mimura; Akiharu Takabayashi, both of Nara; Masahiro Mori, Kyoto; Takeshi Takada, Kyotanabe; Ayako Komori, Joyo, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,872

(22) Filed: Jun. 8, 1998

(30) Foreign Application Priority Data

Jun. 11, 1997 (JP) .................................................... 9-153169

(51) Int. Cl.[7] .................................................... E04D 13/18
(52) U.S. Cl. ............................ 52/173.3; 52/748.1; 136/251
(58) Field of Search ..................................... 136/244, 251; 52/173.3, 748.1

(56) References Cited

U.S. PATENT DOCUMENTS

| | | |
|---|---|---|
| 5,094,697 | 3/1992 | Takabayashi et al. . |
| 5,280,133 * | 1/1994 | Nath ..................................... 174/52.1 |
| 5,409,549 * | 4/1995 | Mori ..................................... 136/244 |
| 5,500,055 | 3/1996 | Toyama et al. . |
| 5,651,837 * | 7/1997 | Ohtuska et al. ...................... 136/251 |

FOREIGN PATENT DOCUMENTS

| | | |
|---|---|---|
| 0 768 721 | 4/1997 | (EP) . |
| 55-55 | 1/1980 | (JP) . |
| 63-50146 | 4/1988 | (JP) . |
| 05-018051 | 1/1993 | (JP) . |
| 5-218469 | 8/1993 | (JP) . |
| 06-140656 | 5/1994 | (JP) . |
| 06-212738 | 8/1994 | (JP) . |
| 07-021932 | 1/1995 | (JP) . |
| 07-211932 | 8/1995 | (JP) . |
| 07-302924 | 11/1995 | (JP) . |
| 08-008168 | 1/1996 | (JP) . |
| 09-096055 | 4/1997 | (JP) . |
| 09-177269 | 7/1997 | (JP) . |

* cited by examiner

Primary Examiner—Beth A. Stephan
Assistant Examiner—Brian E. Glessner
(74) Attorney, Agent, or Firm—Fitzpatrick, Cella, Harper & Scinto

(57) ABSTRACT

In a solar roof member comprising a photovoltaic device encapsulated with an insulating material onto a reinforcing member, the reinforcing member has a joining portion at which an adjoining solar roof member is joined, and a curved portion which is so provided in the reinforcing member as to extend over at least part of the joining portion and through which a lead wire is led out. The solar roof member enables simple roofing without causing wiring mistakes.

18 Claims, 8 Drawing Sheets

SOLAR ROOF MEMBER

BACKGROUND OF THE INVENTION

1. Field of the Invention

This invention relates to a solar roof member which is a solar cell integral type roofing material.

2. Related Background Art

Solar cells can be installed on roofs by methods roughly grouped into two types. One is a method in which solar cells are attached to an existing roof. The other is a method in which solar cells themselves are provided on a roof as roofing materials.

In the former, since the solar cells are installed on the existing roof by the use of some stand, conventional solar cells can be used for that purpose as they are, but they require a high cost for installation and also may give a poor appearance. Accordingly, the latter method has recently attracted notice.

With regard to the latter method, various working methods are commonly known as roofing methods from old times, which typically include hirabuki (boad roofing), tatehazebuki (standing seam roofing), namiitabuki (corrugated sheet roofing), oriitabuki (folding plate roofing), yokobuki (lateral roofing), kawaraboubuki (batten seam roofing), kawarabuki (clay tile roofing) and yousetsubuki (weld roofing) (all native terminology in Japanese own roofing). Also, as to materials for such roofing, various materials such as metals, ceramics, plastics and woods are put into use.

As known techniques making use of solar cells, various working methods have been proposed until now as disclosed in, e.g., Japanese Patent Application Laid-Open Nos. 5-18051 (slate roofing), 7-302924 (lateral roofing) and 7-211932 (batten seam roofing), and their development is on progress in variety in accordance with the various roofing methods and the quality of solar cells.

Attempts to integrally set up solar cells and roofing materials to achieve a cost reduction and an improvement in appearance are not so recently started. However, not a few methods have peculiar problems because of unique operations for lead-wire connection which must be performed when solar cell integral type roofing materials are assembled and also because of restrictions coming from the quality of solar cells and shape or design of roofing materials in the conventional solar cell integral type roofing materials. For example, in a solar cell integral type roofing material disclosed in Japanese Patent Application Laid-Open No. 7-302924 (see FIGS. 1 and 2), a space continuously extends between a sheathing roof board 21 and each roof panel 1 in the lateral direction of the roof (in the direction parallel to the ridge, i.e., in the direction crossing the direction where rain water flows, the direction vertical to the surface of the drawing) when individual solar cell integral type roofing materials are connected with one another by wiring. Wires 22 of roofing materials adjoining in the lateral direction (in the direction parallel to the ridge) can be connected through such a space. However, no space continuously extends in the flow direction of the roof (in the direction vertical to the ridge, i.e., in the direction where rain water flows), and hence the wires can not be connected therethrough. This makes it necessary to assemble the roofing materials according to the following procedure. In the following, the direction parallel to the ridge may be called "lateral direction", and the direction vertical to the ridge may be called "longitudinal direction".

Typical Procedure in the Roofing Shown in FIGS. 1 and 2

(1) First, a joint drip cap board 2 is joined with a solar cell integral type roof panel 1a having already been installed at the lower tier (on the eaves side).

(2) A lead wire 3b of a solar cell integral type roof panel 1b having already been installed adjoiningly side by side before the step (1) is passed around the back of the joint drip cap board 2 and led out.

(3) The roof panel 1b is fastened to the sheathing roof board 21 with a screw or the like by means of a clip 23 (see FIG. 2).

(4) The lead wire 3b of the roof panel 1b having been installed and one lead wire 3c of another solar cell integral type roof panel 1c to be installed subsequently are connected with each other through a connector 4.

(5) The roof panel 1c is joined with a roof panel 1a having been installed at the lower tier (on the eaves side), and is fitted onto joint drip cap boards 2 having been set on its both sides.

(6) Subsequently, the procedure of steps (1) to (5) is repeated to install the roof panels.

(7) After the roofing for one row or roofing up for the all, joint covers 5 are set over to complete the roofing.

In the working method of lateral roofing as described above, the solar cell integral type roof panels can mutually be wire-connected only in the space continuously extending in the lateral direction, and hence the wiring can only be made at a low degree of freedom. Also, the wiring is operated through the back of each roof panel, and hence it must be done simultaneously with the installation of the roof panels. Thus, it has been required to simultaneously make troublesome operations concerning the wiring arrangement when the roof panels are installed. This has caused a problem that roofing workers having a poor electrical know-how often make wiring mistakes, especially causing a problem in the case of roof panels of the type they can not be exchanged in part after roofing where the roofing is performed in the order of from the eaves side to the ridge side as in the lateral roofing or clay tile roofing.

To cope with this problem, Japanese Patent Application Laid-Open Nos. 5-18051 (see FIG. 3) and 7-21932 (see FIG. 4) disclose that a spacer member 31 or 41 is provided between a sheathing roof board 32 or 42 and each solar cell integral type roof panel 33 or 43 to ensure the degree of freedom for the wiring so that the roofing can be performed in less compliancy. These roofing methods, however, make it necessary to additionally set spacer members which are unnecessary for structural strength, and can not avoid resulting in a higher cost from both aspects of the material cost and the roofing cost for setting such members.

SUMMARY OF THE INVENTION

The present invention solves the problems discussed above. Accordingly, an object of the present invention is to provide a solar roof member as a solar cell integral type roof panel, and a roofing method therefor, that can ensure the degree of freedom for wiring without providing any spacer member and also can prevent troubles such as wiring mistakes that may otherwise be caused by complicated wiring operations at the time of roofing.

The present invention made in order to achieve the above object is constituted as described below.

That is, the present invention is a solar roof member comprising a photovoltaic device encapsulated with an insulating material onto a reinforcing member, wherein;

the reinforcing member has a joining portion at which an adjoining solar roof member is joined, and a curved portion through which a lead wire is led out and which is so provided in the reinforcing member as to extend over at least part of the joining portion.

The present invention also provides a process for manufacturing a solar roof member, comprising the steps of:

encapsulating a photovoltaic device with an insulating material onto a reinforcing member;

bending at least part of the reinforcing member to form a joining portion for joining a solar roof member; and forming in the reinforcing member a curved portion so formed as to extend over at least part of the joining portion.

The present invention still also provides a roofing method for installing the solar roof member of the present invention, comprising leading out a lead wire through the curved portion of the reinforcing member to a roof base member on which an adjoining solar roof member has not been installed when solar roof members are installed on the roof base member.

BRIEF DESCRIPTION OF THE DRAWINGS

FIG. 7A is a plan view, and FIG. 7B is a cross-sectional view.

DESCRIPTION OF THE PREFERRED EMBODIMENTS

Figure 1:
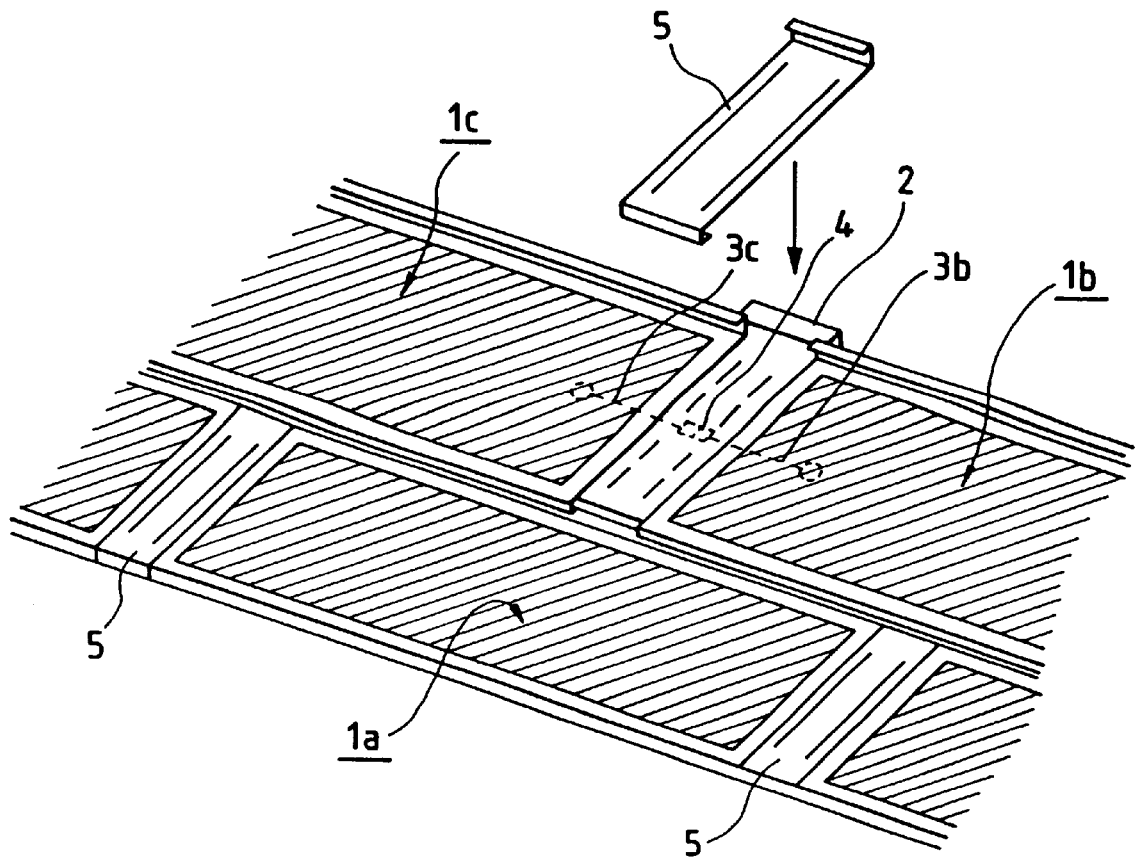
FIG. 1 is a diagrammatic perspective view to illustrate an example for installing solar cell integral type lateral-roofing roof panels.
Figure 2:
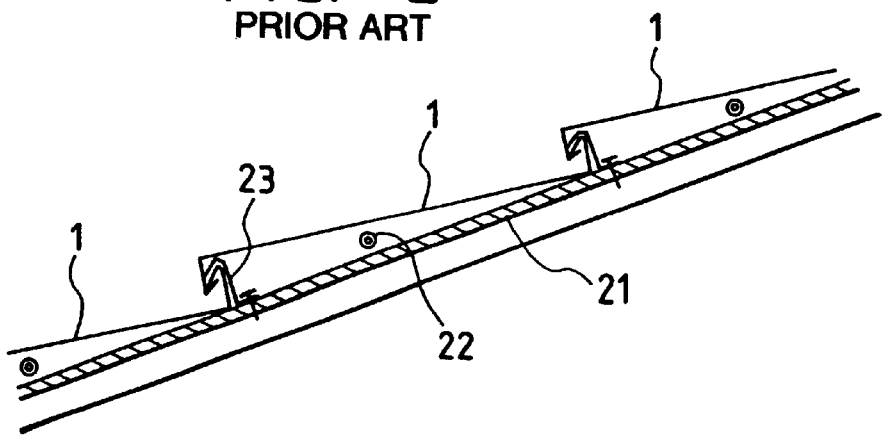
FIG. 2 is a diagrammatic cross-sectional view to illustrate an example for connecting the solar cell integral type lateral-roofing roof panels.
Figure 3:
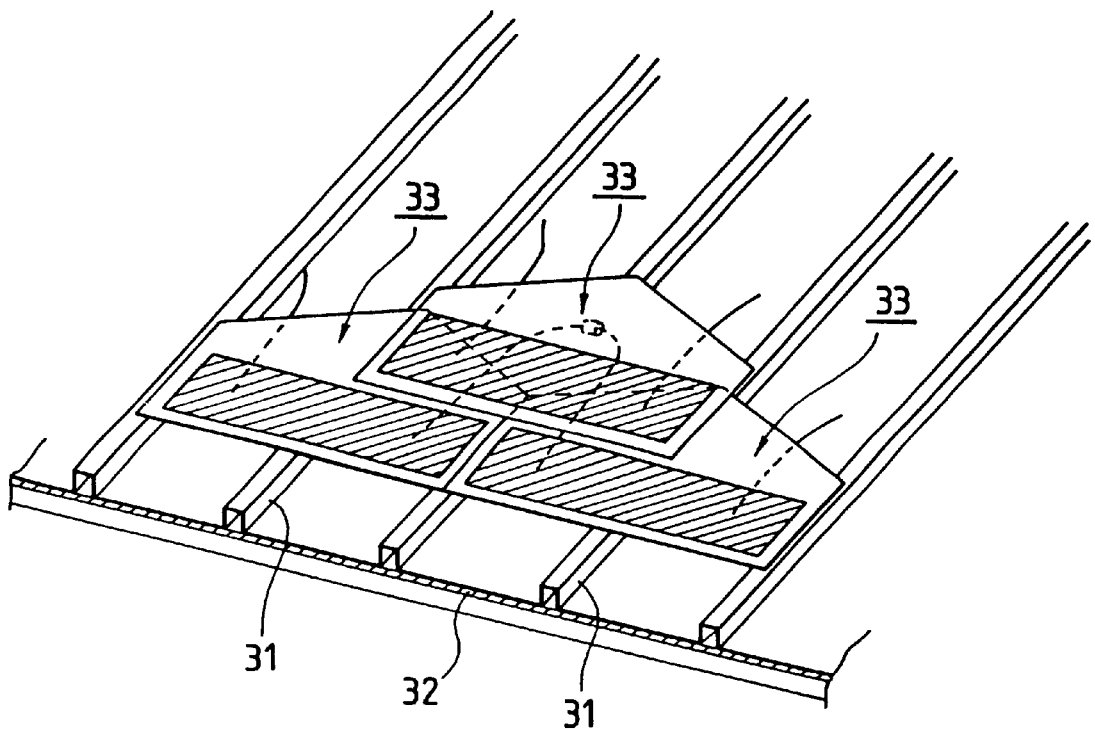
FIG. 3 is a diagrammatic perspective view to illustrate an example for installing solar cell integral type slate roof panels.
Figure 4:
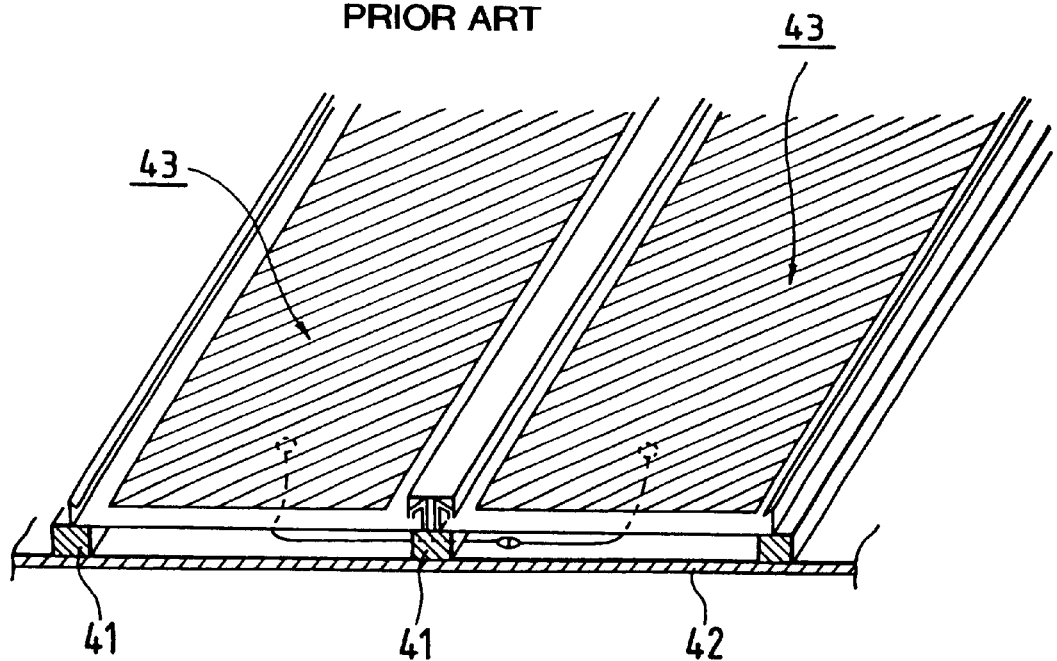
FIG. 4 is a diagrammatic perspective view to illustrate an example for installing solar cell integral type batten seam roofing roof panels.

The solar roof member or solar cell integral type roof panel of the present invention comprises a photovoltaic device encapsulated with an insulating material onto a reinforcing member. The reinforcing member has a joining portion at which an adjoining solar roof member is joined, and a curved portion which is so provided in the reinforcing member as to extend over at least part of the joining portion and through which a lead wire is led out.

The curved portion may be curved in any form (e.g., outward or inward, or upward or downward) so long as a space or gap through which the lead wire can be led out is provided between the reinforcing member and the roof base (sheathing roof board).

In the solar cell integral type roof panel (solar roof member) of the present invention, the curved portion through which a lead wire is led out is so provided in the reinforcing member as to extend over its joining portion. This makes it possible to perform roofing while leading out a lead wire through the curved portion of the reinforcing member to a roof base on which an adjoining solar roof member has not been spread. Hence, it is unnecessary to pass around the lead wire beneath the joint drip cap board, and also it is possible to operate lead-wire connection later. Thus, the workers may no longer be worried about the wiring arrangement when solar cell integral type roof panels are installed. More specifically, the workers may connect lead wires between the roof panels after the roof panels have been installed for one row, and may connect them with connectors at the time the joint covers are fitted, or may readily divide the work so that the operation to connect lead wires while checking the output of the roof panels can be left to electrical engineers.

In the solar cell integral type roof panel of the present invention, a lead-wire lead-out portion (terminal portion) may preferably be provided on the back of the roof panel at its part that forms the space between the roof panel and the roof base (sheathing roof board) and may be less deformed by external force, i.e., the part where stress is not so much applied during the roofing. Stated specifically, the terminal portion may preferably be provided at the curved portion or a flat portion in the vicinity thereof, or a flat portion in the vicinity of the joining portion. Also, the terminal portion may preferably be provided at a portion near the both side portions of the roof panel. This is because the lead wire can be provided in the smallest length; any surplus wires at the time of roofing may get tangled to make troubles during the roofing.

With regard to the process for manufacturing the solar cell integral type roof panel of the present invention, the curved portion can be formed with ease only by pressing, when a metallic sheet is used as the reinforcing member constituting the roof panel. Meanwhile, when a ceramic plate is used as the reinforcing member, the solar cell (photovoltaic device) may be encapsulated onto a reinforcing member previously molded into a product having the joining portion and the curved portion. In an instance where the solar cell itself has no flexibility, a non-electricity-generation region may be provided in the effective-width portion of the roof panel so that the curved portion can be formed in this non-electricity-generation region by pressing or the like.

The constitution of a typical example of the solar cell integral type roof panel of the present invention, a process for its manufacture and also a roofing method for installing such a solar cell integral type roof panel will be described with reference to FIGS. 5 to 10.

In the present example, amorphous silicon solar cells each fabricated on a stainless steel substrate are connected in series to form solar cell blocks, which are encapsulated with an insulating material onto a galvanized steel sheet serving as the reinforcing member (or reinforcing sheet) to make up a solar cell module, and the module is formed into a lateral-roofing material by bending and is further formed so as to be provided with a curved portion serving as the lead-wire lead-out portion, to obtain the solar cell integral type roof panel. In the example for its installation, a large number of solar cell integral type roof panels thus obtained are installed on a heat-insulating sheathing roof board.

Figure 5:
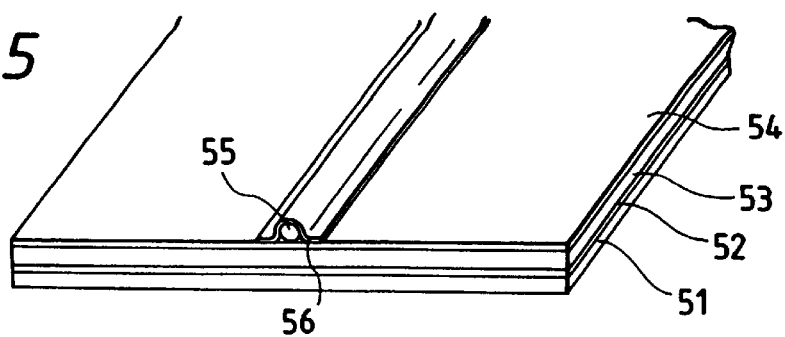
FIG. 5 is a diagrammatic perspective view to illustrate a preferred example of the constitution of a solar cell used in the solar cell integral type roof panel of the present invention.

First, the procedure of fabricating the amorphous silicon solar cell will be described with reference to FIG. 5.

On a cleaned 0.1 mm-thick roll-type continuous stainless-steel substrate (a conductive substrate 51), an Al—ZnO deposited film (a back reflective layer 52) is formed by sputtering in a layer thickness of 5,000 Å. Next, n-i-p amorphous silicon semiconductor layer (semiconductor layer 53) is formed by successively depositing an n-type semiconductor layer of 300 Å thick, an i-type semiconductor layer of 4,000 Å thick and a p-type semiconductor layer of 100 Å thick by plasma enhanced CVD using gases of $PH_3$, $SiH_4$ and $H_2$ for the n-type semiconductor, gases of $SiH_4$ and $H_2$ for the i-type semiconductor and gases of $B2H6$, $SiH_4$ and $H_2$ for the p-type semiconductor, respectively.

Thereafter, an ITO film (a transparent conductive layer 54) is formed in a thickness of 800 Å by sputtering. Thus, an amorphous silicon solar cell is formed. Next, the continuous-sheet solar cell is punched out into squares of 30 cm long and 30 cm wide in size by means of a pressing machine to prepare a plurality of solar cells. Here, at the cut surfaces of the solar cells cut out by the pressing machine, the solar cells are crushed and the ITO electrode and the stainless steel substrate stand short-circuited.

Figure 6A:
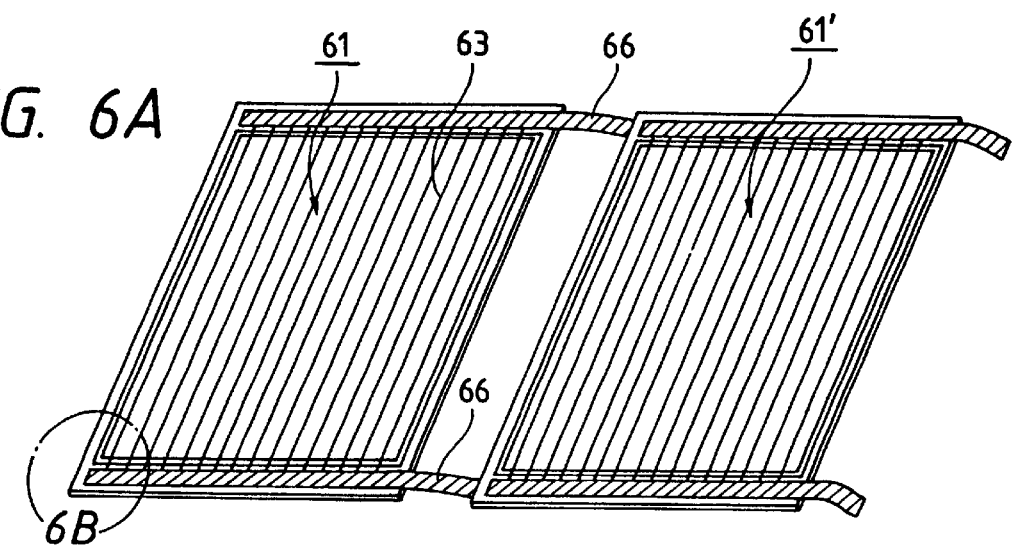
FIGS. 6A and 6B are diagrammatic perspective views to illustrate a preferred example of the constitution of solar cell blocks used in the solar cell integral type roof panel of the present invention.
Figure 6B:
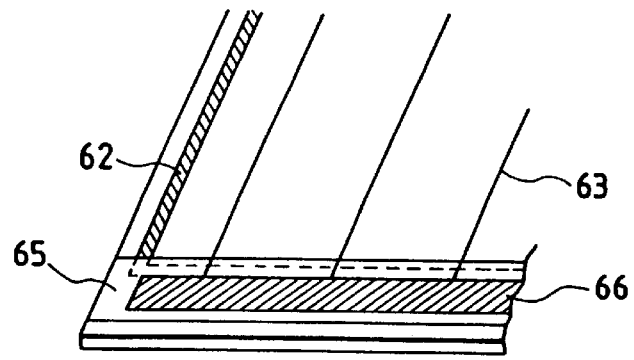

Since the amorphous silicon solar cells have a very small layer thickness, they have some short-circuited areas in their semiconductor layers. Accordingly, in order to repair the short circuits, as shown in FIGS. 6A and 6B, a cell separation zone 62 is provided along the periphery of the ITO electrode of each solar cell 61 to remove the short circuits along the substrate edges. Incidentally, FIG. 6B is an enlarge view of the circled area in FIG. 6A. Stated specifically, the short circuits are removed in the following way: First, the solar cell is immersed in an aqueous solution of 8% of aluminum chloride hexahydrate. An opposing electrode patterned in a width of 0.5 mm, which is narrower by 1 mm than the cell, is set opposite at a distance of 1 mm from the transparent electrode of the solar cell, and a DC of 0.5 s and 25 A is applied using a sequence controller to form the cell separation zone 62. Next, the opposing electrode is replaced with a stainless steel flat sheet having the same size as the solar cell and is set opposite at a distance of 4.0 cm, where a bias of 4.5 V is applied using the sequence controller. Thus, the ITO electrode is removed at its part where the short circuits have occurred at the time of film formation. In this way, a solar cell whose short-circuited areas have been repaired is formed.

The solar cell thus formed is washed with water, followed by drying. Next, on the ITO film, 100 micron thick copper wires 55 coated with silver are fastened with a carbon conductive adhesive 56 as a collector grid electrode (see FIG. 5). When they are fastened, a polyimide tape 65 is stuck to the non-electricity-generation region on each side edge of the solar cell 61 so that the copper wires 63 do not come into contact with the edge faces of the stainless steel substrate 51, and then a copper tape 66 is bonded onto the polyimide tape 65. Thus, the positive pole of the solar cell is formed.

Next, the copper tape 66 stuck to the solar cell 61 is passed around the back of an adjoining solar cell 61' on its stainless steel substrate side, and is connected in series with the stainless steel substrate of the solar cell 61'. With regard to the final electric output of the solar cell thus prepared, in order to lead out the lead wire from the back of the solar cell, the above copper tape is previously passed around the back of the solar cell having each final output, with an insulating material interposed on the side of the stainless steel substrate. Similarly, the negative pole is formed by directly soldering the copper tape to the stainless steel substrate. FIGS. 6A and 6B show a group of series-connected solar cells (i.e., solar cell blocks) thus prepared.

Figure 7A:
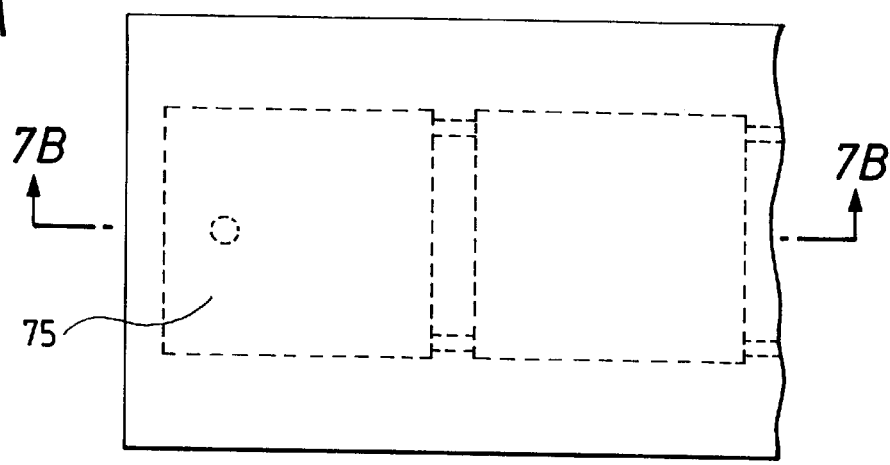
FIGS. 7A and 7B are diagrammatic views to illustrate an example of the constitution of the solar cell integral type roof panel of the present invention.
Figure 7B:
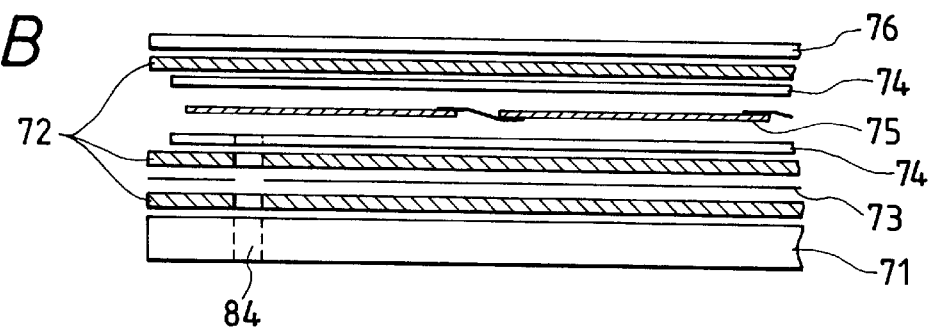

Next, as shown in a plan view FIG. 7A and a cross-sectional view FIG. 7B (a cross section along the line 7B–7B in FIG. 7A), onto a galvanized steel sheet 71 of 0.8 mm thick serving as the reinforcing sheet, a filler 72, an insulating film 73, a filler 72, a glass fiber 74, solar cell blocks 75, a glass fiber 74, a filler 72 and a fluorine resin film 76 are successively superposed, and the fillers are melted at 150° C. for 30 minutes by means of a vacuum laminator. Thus, a resin-encapsulated flat-shaped solar cell module is prepared.

Figure 8:
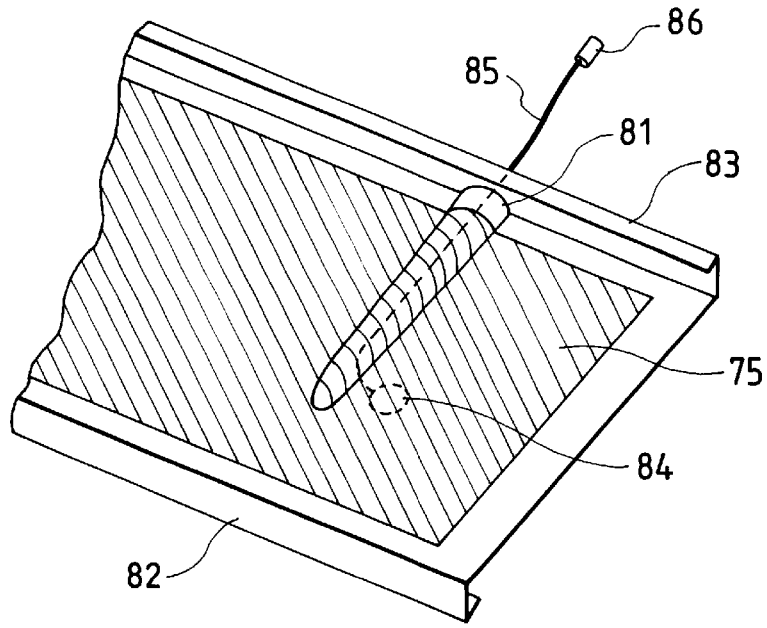
FIG. 8 is a diagrammatic perspective view to illustrate a preferred example of the solar cell integral type roof panel of the present invention.

Next, the solar cell module thus prepared is bent at edge faces of its reinforcing sheet into the shape as shown in FIG. 8 to obtain a solar cell integral type roof panel. More specifically, at a joining portion 82 on the eaves side, the edge face is bent downward and also its edge is further bent toward the ridge side. At a joining portion 83 on the ridge side, an edge face is raised by 90 degrees and also its edge is further bent toward the eaves side. A curved portion 81 is also so formed as to extend over part of the ridge-side joining portion 83.

The above joining portions 82 and 83 can be readily formed by means of a known roller forming machine. Since, however, the curved portion 81 can not be formed by the roller forming machine, it must be formed by a known pressing machine after the joining portions have been formed by the roller forming machine.

After the joining portions have been formed in this way, junction boxes and lead wires are attached. Each lead wire to be led out of the solar cell is passed through a hole 84 previously made in the galvanized steel sheet 71 at its flat area on the back of the solar cell and in the vicinity of the curved portion 81. The lead wire 85 is led from the positive pole or negative pole on the back of the solar cell by soldering, and a junction box (not shown) is stuck onto the soldered portion to mechanically strengthen that portion. After the lead wire 85 is led out through the curved portion 81, a connector 86 is attached to its end.

Figure 9:
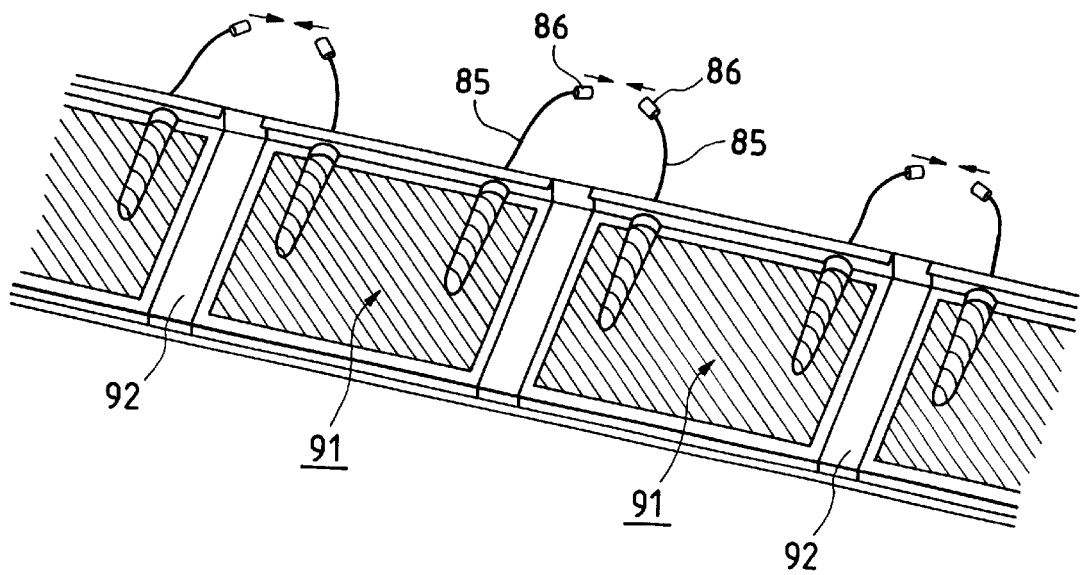
FIG. 9 is a diagrammatic perspective view to illustrate a procedure for installing the solar cell integral type roof panel shown in FIG. 8.
Figure 10:
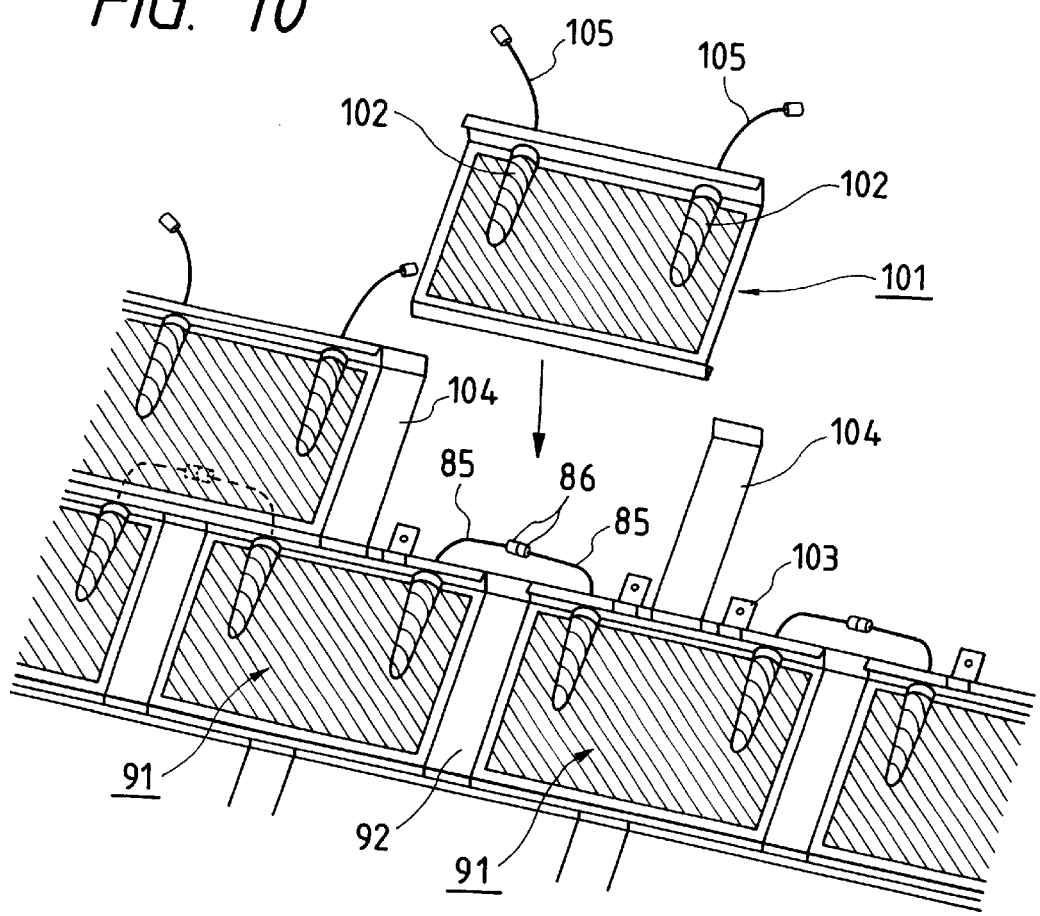
FIG. 10 is a diagrammatic perspective view to illustrate a procedure for installing the solar cell integral type roof panel shown in FIG. 8.

An example of the procedure of roofing with use of the solar cell integral type roof panel will be described below with reference to FIGS. 9 and 10. For convenience of description, the procedure starts from the state where the lower-tier (the eaves-side) roof panels 91 have been installed as shown in FIG. 9.

(1) First, a joint drip cap board 104 is joined with a roof panel 91 having already been installed at the lower tier (on the eaves side).

(2) A solar cell integral type roof panel 101 is joined with a roof panel 91 having already been installed on the lower tier (the eaves side), which is joined while putting lead wires 105 aside toward the ridge side by utilizing curved portions 102, and is also fitted onto joint drip cap boards 104 having been set on its both sides.

(3) The roof panel 101 is fastened to the sheathing roof board by means of a clip 103.

(4) Subsequently, the procedure of steps (1) to (3) is repeated to install the roof panels.

(5) After the roofing up for one row all, the lead wires are connected with the connectors 86, and joint covers 92 are are set over joint drip cap boards 104 to complete the roofing for one row of the roof.

(6) The procedure of (1) to (5) is further repeated on the rows of upper tiers. Thus, the roofing is all completed.

As described above, wiring within the space between the roof panel and the sheathing roof board, including the space at the joining portion, is excellent in not only protection of electrical wiring from outdoor environment but external appearance.

In the description of the roofing in the present embodiment, the electrical connection between the solar cell integral type roof panels is described only on their connection in the lateral direction. Alternatively, as will be easily understood, the lead wire may be led out in the longitudinal direction to the back of another roof panel on a different row, utilizing the curved portion 81 (see FIG. 8). Utilization of such a feature can make it easy to arrange the solar cell integral type roof panels of the present embodiment not only in series but also in parallel at any place. Thus, a great degree of freedom can be ensured on the wiring.

Utilization of the production process as described in the present embodiment is also feasible for mass production because the encapsulation of the solar cell onto a flat sheet promises a superior mass productivity, and the formation of the joining portions and curved portion that may be carried out thereafter is greatly effective for cost reduction in such mass production.

As in the present embodiment, a flexible reinforcing sheet such as a metal sheet is used as the reinforcing sheet. Thus, the joining portions and curved portion can be designed in variety with ease, and can meet various demands on design. Hence, flat-sheet standard products may previously be prepared so that they can be formed into desired shape according to orders. This enables reduction of excess stock to bring about a great commercial advantage.

A flexible photovoltaic device may be used as the solar cell (photovoltaic device), where the solar cell can be provided also at the curved portion. This can make output power larger when the roof panels are applied to buildings having restrictions on installation area on roofs, bringing about a great advantage.

The present embodiment (hereinafter often "Preferred Embodiment") has been described on the solar cell integral type roof panel in which the lateral-roofing material and the solar cell are set integral. The present invention is by no means limited to such a lateral-roofing roof panel. Needless to say, the present invention can be applied to all types of solar cell integral type roof panels in which the wires are connected in the space formed between the roof panel and the sheathing roof board (including the space at the joining portions).

The respective members constituting the solar cell integral type roof panel will be further described below in detail while also giving their definition and the general consideration of the present invention.

Solar Cell Integral Type Roof Panel

The solar cell integral type roof panel in the present invention refers to a solar cell module which can be directly installed on the roofing base (e.g., the sheathing roof board) and in which the solar cell and the reinforcing sheet (a roofing material) giving the external shape of a roof are set integral.

Reinforcing Member

A typical reinforcing member giving the shape of the roof panel in the present invention is a reinforcing sheet made of metal. As the metal, steel sheets having a strength and non-ferrous metals having a good corrosion resistance may be used like those in conventional metal roofs. The steel sheets include surface-treated or coated steel sheets, alloy or special sheets incorporated with other elements and also composite steel sheets laminated with a heat insulating material or the like. It is common to use hot-dip galvanized steel sheets, galvanized steel sheets, galvanizing-alloy coated steel, hot-dip aluminized steel sheets, copper-coated steel sheets, vinyl-chloride-coated steel sheets, fluorine-resin-coated steel sheets, stainless steel sheets, vibration-damping steel sheets, heat insulating galvanized steel sheets, weather-resistant steel sheets, and other coated steel sheets. As the non-ferrous metals, copper sheets, aluminum alloy sheets, zinc alloy sheets, lead sheets, titanium sheets and other coated color sheets may be used. In the above Preferred Embodiment, a metal sheet is used as the reinforcing sheet, to which the present invention is by no means limited. Needless to say, ceramic or plastic materials conventionally widely used in roofs may also be applied.

Solar Cell

There are no particular limitations on the type of the solar cell used in the present invention. In view of the advantage that the light-receiving area of the solar cell can be kept also at curved portions, it is preferable and effective to use a flexible solar cell formed on a flexible substrate made of stainless steel or resin. FIG. 5 shows an amorphous silicon solar cell which is an example of the flexible solar cell. The substrate 51 is a member on which semiconductor layers are mechanically supported in the case of thin-film solar cells formed using amorphous silicon, and may also be used as an electrode in some instances. Such a substrate 51 is required to have a heat resistance endurable to the temperature of heating when the semiconductor layers are formed, but may be either conductive or electrically insulating. As conductive materials, the substrate may include thin sheets of metals such as Fe, Ni, Cr, Al, Mo, Au, Nb, Ta, V, Ti, Pt, Pb and Ti or alloys of any of these as exemplified by brass and stainless steel, and composite substrates thereof, as well as carbon sheets and galvanized steel sheets. As electrically insulating materials, the substrate may include films or sheets of heat-resistant synthetic resins such as polyester, polyethylene, polycarbonate, cellulose acetate, polypropylene, polyvinyl chloride, polyvinylidene chloride, polystyrene, polyamide, polyimide and epoxy resin, or composite substrate thereof with glass fiber, carbon fiber, boron fiber or metal fiber, and any of these metal thin sheets and resin sheets on the surfaces of which a metal thin film of a different kind and/or an insulating thin film of $SiO_2$, $Si_3N_4$, $Al_2O_3$ or AlN has been formed by sputtering, vapor deposition or plating to make surface coating treatment, as well as glass and ceramics.

The lower electrode (back reflective layer) 52 is one electrode from which the power generated in the semiconductor layers is taken out, and is required to have a work function that provides ohmic contact with respect to the semiconductor layers. As materials therefor, single metals, alloys thereof and transparent conductive oxides (TCO) may be used, as exemplified by Al, Ag, Pt, Au, Ni, Ti, Mo, W, Fe, V, Cr, Cu, stainless steel, brass, Nichrome, $SnO_2$, $In_2O_3$, ZnO and ITO. Such a lower electrode 52 may preferably have a smooth surface, or may be textured when irregular reflection of light should be caused, and is also called a back reflective layer. The lower electrode 52 need not particularly be provided when the substrate 51 is conductive.

The lower electrode 52 may be prepared by a process such as plating, vapor deposition or sputtering. The upper electrode 54 may be prepared by a process such as resistance heating vapor deposition, electron beam heating vapor deposition, sputtering or spraying. These may appropriately be selected as desired.

Semiconductor materials constituting the semiconductor layer 53 which corresponds to the photovoltaic device may include Group IV and Group IV alloy type amorphous semiconductors such as a-Si:H, a-Si:F, a-Si:H:F, a-SiGe:H, a-SiGe:F, a-SiGe:H:F, a-SiC:H, a-SiC:F and a-SiC:H:F. Semiconductor materials constituting the p-type layer and n-type layer are obtainable by doping the above semiconductor materials with valence electron control agents. As valence electron control agents for obtaining the p-type semiconductors, compounds containing an element belonging to Group III of the periodic table may be used as materials. The element belonging to Group III may include B, Al, Ga and In. As valence electron control agents for obtaining the n-type semiconductors, compounds containing an element belonging to Group V of the periodic table may be used. The element belonging to Group V may include P, N, As and Sb.

The amorphous silicon semiconductor layers may be formed by a known process such as vapor deposition, sputtering, RF (radio-frequency) plasma enhanced CVD (chemical vapor deposition), microwave plasma enhanced CVD, ECR (electron cyclotron resonance) processing, thermal CVD or LPCVD (low-pressure CVD). As a process employed in an industrial scale, the RF plasma enhanced CVD is preferably used, in which starting gases are decomposed with plasma and films are deposited on a substrate. In the RF plasma enhanced CVD, it is questioned that the starting gas decomposition efficiency is as low as about 10% and that the deposition rate is as low as from 1 Å/sec to 10 Å/sec. As a film forming process that can solve these points, the microwave plasma enhanced CVD has attracted notice. As a reactor for carrying out the above film formation, any known apparatus such as a batch type reactor and a continuous film-forming apparatus may be applied as desired.

In the solar cell of the present invention, what is called tandem cells or triple cells having two or more semiconductor junctions superposed together may be used for the purpose of improving spectral sensitivity and voltage.

The upper electrode (transparent electrode) 54 is an electrode for taking out the photovoltaic energy generated in the semiconductor layers, and forms a pair with the lower electrode 52. Since the upper electrode 54 is positioned on the light incident side, it must be transparent, and is also called a transparent electrode. The upper electrode 54 may preferably have a light transmittance of at least 85% so that the light coming from the sun or white fluorescent lamps can be absorbed in the semiconductor layer in a good efficiency. Also, from an electrical viewpoint, it may preferably have a sheet resistivity of not higher than 100 ohms per square so that the currents generated by light can be made to flow laterally with respect to the semiconductor layers. Materials having such properties may include metal oxides such as $SnO_2$, $In_2O_3$, ZnO, CdO, $CdSnO_4$ and ITO ($In_2O_3+SnO_2$).

To determine the active area of electricity generation in the photovoltaic device, the transparent electrode 54 may be etched away by a known etching technique, e.g., any desired process of chemical etching, print etching or electrochemical etching, to form etching lines for the collector electrode 63.

Thereafter, the collector electrode 63 is formed on the transparent electrode 54 by a process such as sputtering, vapor deposition, printing or bonding, using a metal or a conductive paste.

The amorphous silicon solar cell thus produced has a great flexibility in itself, and can be a flexible solar cell having properties preferable for the present invention.

Encapsulation Material

The solar cell prepared as described above is encapsulated in the roof panel (on the reinforcing sheet). Encapsulation materials used therefor are required to be durable to outdoor use and also to have performance as roofs. Stated specifically, as materials satisfying such performance, EVA (ethylene-vinyl acetate copolymer), EEA (ethylene-ethyl acrylate copolymer), PVB (polyvinyl butyral) and so forth may preferably be used in respect of the adhesive layer (filler) 72, in view of adhesion to the solar cell, weatherability and cushioning effect. These may be used in combination with a reinforcing material such as nonwoven glass fabric or silica in order to improve mechanical properties. In order to improve moisture resistance and scratch resistance, a fluorine type resin may be superposed as a surface protective layer. The fluorine type resin may include, e.g., polymers of tetrafluoroethylene TFE (e.g., TEFLON, trade name; available from Du Pont), copolymers of tetrafluoroethylene with ethylene ETFE (e.g., TEFZEL, trade name; available from Du Pont), polyvinyl fluoride (e.g., TEDLAR, trade name; available from Du Pont) and polychlorofluoroethylene CTFE (NEOFLON, trade name; available from Daikin Industries, Ltd.). To these resins, known ultraviolet absorbers may be added to improve weatherability. In order to improve adhesion to the adhesive layer, films surface-roughed by a process such as corona discharge treatment are more preferred. Those of a non-stretched type are still more preferred so that the film can accord with various bend.

As an example of methods for the encapsulation, a method is well known in which the reinforcing sheet (such as a metal, glass, ceramic or plastic sheet), the solar cell and the resin films are contact-bonded with heating in vacuum by means of a known apparatus such as a vacuum laminator.

The solar cells may be so arranged on the reinforcing sheet as to be held only within the effective width of the reinforcing sheet when viewed as roofing materials. This is preferable in view of their formation into roofing materials. Also, the interface between the collector electrode 63 and the transparent conductive film 54 is a part having the lowest adhesion strength. Accordingly, in an instance where the solar cell itself is bent by pressing, it may preferably be bent in the direction parallel to the lengthwise direction of the collector electrode 63.

Junction Box

The junction box used in the present invention has the function to protect the lead wire led out of the solar cell from mechanical external force and simultaneously protect the lead wire and the joints of the solar cell from foreign matter such as water and dust. Accordingly, the junction box is required to have excellent heat resistance, water resistance, electrical insulating properties and aging resistance. It may preferably be made of a material having a good adhesion to the filler 72.

Taking the above factors into account, the junction box may preferably be made of a plastic. Taking account of flame retardance, a flame-retardant plastic or a ceramic is preferred. For example, the plastic may include engineering plastics having excellent strength, impact resistance, heat resistance, hardness and aging resistance, as exemplified by Noryl, polycarbonates, polyamides, polyacetals, modified PPO, polyesters, polyarylates, unsaturated polyesters, phenol resins and epoxy resins. Thermoplastic resins such as ABS resin, PP and PVC may also be used.

Sealing Medium

Sealing mediums which may be used to fill the inside of the junction box are used in order to prevent electrical leak even in case of a leak of water. There are no particular limitations on materials therefor. As for their types, epoxy resin type adhesives, silicone type potting mediums and silicone type adhesive sealing mediums are preferred, as having good electrical insulating properties. Taking account of flexibility, silicone type resins are more preferred. Taking account of operability, those of a one-pack type and capable of curing in a short time are still more preferred, and those having a low viscosity and with which even narrows can be filled are much more preferred. When silicone one-pack type RTV (room temperature vulcanizing) rubbers are used, the curing system may preferably be of a deacetone type or of a dealcohol type so that the electrodes are not attacked. For example, among epoxy resin type adhesives available from Three Bond Co., Ltd., those available as 2001, 2002H, 2003, 2016B and 2022 (trade names) may be used. The above epoxy resins may be used in the form of a mixture with a curing agent such as 2102B, 2103, 2104, 2105F, 2105C, 2106, 2131B, 2131D, 2131F or 2163 (trade names) in a certain proportion.

Lead Wire

Under the structure wherein wiring is provided on the back of roof panels, the requirements for water resistance and weatherability can be relaxed. Hence, there is an advantage that lead wires constituted of known inexpensive materials as standardized in JIS or the like can be used. Incidentally, when the connectors are all used to connect lead wires as in the above Preferred Embodiment, the wires can be detached with ease when checked. This is preferable because the wiring can be checked with ease.

Roof Base Member

There are no particular limitations on the roof base on which the solar cell integral type roof panels of the present invention are installed, so long as it is a member usually used for roofs. Preferably, it may be a board having a heat insulating performance. In usual roofing, an under-roofing material having a water resistance is spread on this roof base. The solar cell integral type roof panels are fastened to such a roof base by the use of the clips 103 as previously mentioned. A typical roof base includes the sheathing roof board used also in the above Preferred Embodiment, and besides include mortar, wood wool (or excelsior) cemented boards, plywood, wood chip cemented boards, polystyrene foams, polyurethane foams, polyethylene foams, glass wool, rock wool and insulation boards, any of which may be used. As the under-roofing material, known materials such as asphalt roofings may be used.

Clip

The clip typifies metal fixtures for fastening roof panels to the base of the roof, and is conventionally known to include those of various shapes corresponding to the shapes of roof panels. The clip 103 is a member for substantially ensuring wind pressure resisting strength, and hence a steel member having a thickness larger than the roof panel and having a mechanical strength is commonly used.

EXAMPLES

Example 1

Figure 11:
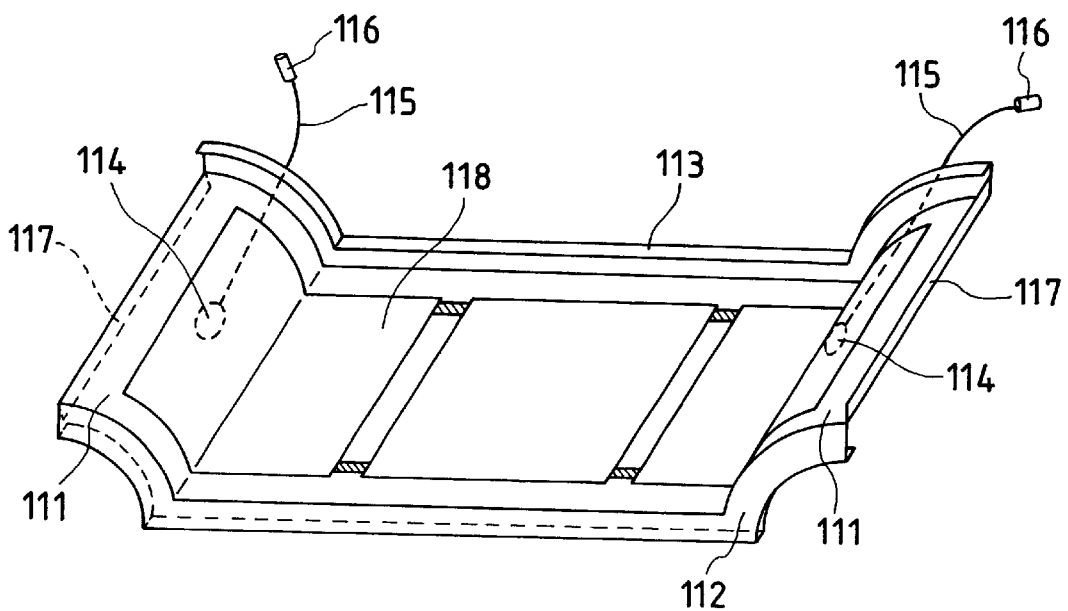
FIG. 11 is a diagrammatic perspective view of a solar cell integral type roof panel according to Example 1.
Figure 12:
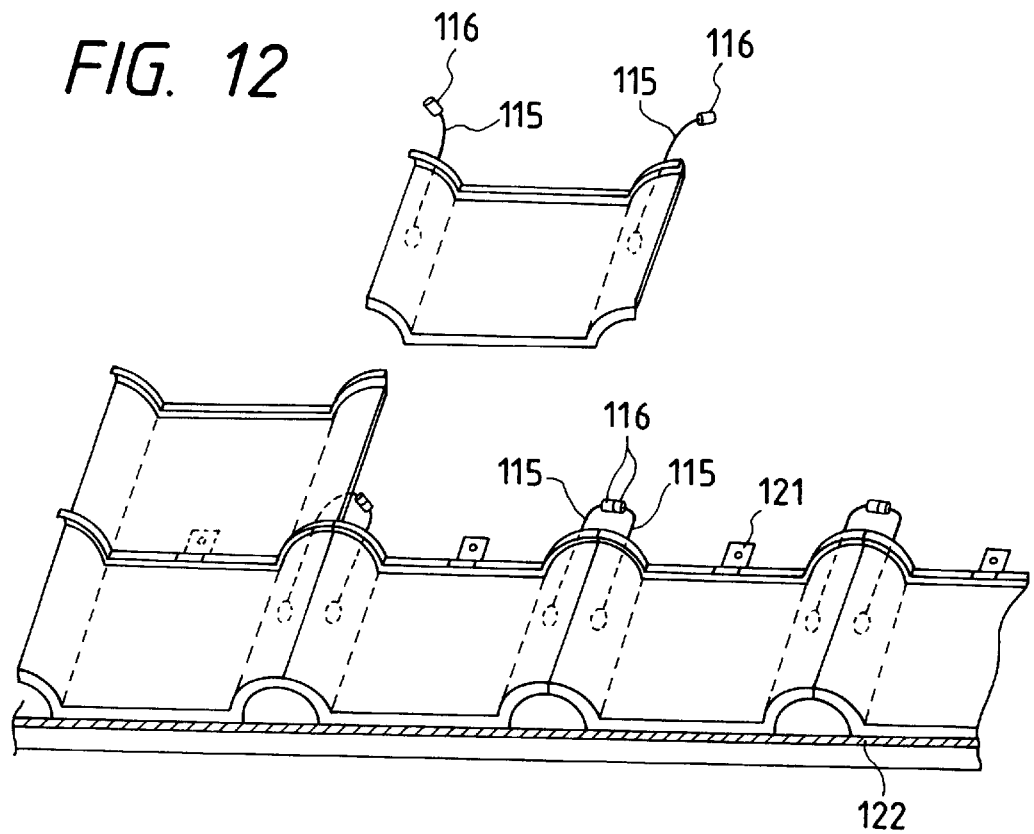
FIG. 12 is a diagrammatic perspective view to illustrate a procedure for installing the solar cell integral type roof panel in Example 1.

FIG. 11 illustrates a solar cell integral type roof panel according to the present Example. FIG. 12 illustrates a procedure for installing the roof panel.

The solar cell integral type roof panel in the present Example is constituted of an amorphous silicon photovoltaic device encapsulated with an encapsulation material onto a galvanized steel sheet, and is characterized by having joining portions 117 also in the lateral direction, which are different from those of the solar cell module shown in FIG. 8.

The solar cell integral type roof panel according to the present Example will be described below in detail with reference to FIG. 11.

Amorphous silicon photovoltaic devices each having a stainless steel substrate were used as photovoltaic devices, and they were assembled in plurality in the same manner as in the Preferred Embodiment, to form photovoltaic device blocks 118.

Non-stretched type ETFE (ethylene-tetrafluoroethylene copolymer; TEFZEL, trade name; available from Du Pont) was used as a surface cover film, EVA (ethylene-vinyl acetate copolymer) and glass fiber nonwoven fabric as fillers, and PET (polyethylene terephthalate) as an insulating film. These make up the photovoltaic device blocks 118 insulatingly encapsulated and bonded to the reinforcing sheet with the fillers (having the same basic constitution as the one shown in FIGS. 7A and 7B). Thus, a flat-shaped solar cell module was prepared.

As the reinforcing sheet, a known galvanized steel sheet (TAIMA COLOR GL, trade name; available from Daido Kohan K.K.) was used. The photovoltaic device blocks were so disposed that the edges of photovoltaic devices do not extend to the tops of hills of curved portions 111 formed after bending. This is because the edges (series-connecting portions) of the photovoltaic devices has the lowest mechanical strength and because the tops of the hills of curved portions 111 in the present Example are portions to which the greatest stress is applied when bent to form them or when stepped during the roofing.

Next, the flat-shaped solar cell module thus prepared was seam-bent by means of a roll forming machine to form an eaves-side joining portion 112 and a ridge-side joining portion 113. Thereafter, wave-shaped curved portions 111 and lateral-direction joining portions 117 were formed by pressing to form a roof panel. The pressing was carried out in such a form that the module is held between wave-shaped top and bottom forces.

Finally, lead wires 115 for taking out electric power were led out through holes 114 made in the steel sheet on the back at its curved portions 111 provided at the edges of the roof panel. In this way the lead wires can be directly led out on the back of the curved portions at the edges of each roof panel, thus the lead wires can be made shortest. The holes 114 were beforehand made in the reinforcing sheet, through which positive-pole and negative-pole lead wires 115 were led out. At the lead-out portions, junction boxes made of polycarbonate were provided for the purpose of insulation protection and water-proofing. At the ends of the lead wires 115, connectors 116 were attached.

The procedure for installing roof panels in the present Example will be described below with reference to FIG. 11 and 12.

(1) The eaves-side joining portion 112 is joined with a ridge-side joining portion of a roof panel having already been installed on the lower tier (the eaves side), which is joined while putting lead wires 115 aside toward the ridge side by utilizing the curved portions 111 of the solar cell integral type roof panel. Also, this roof panel is fitted to a laterally adjoining roof panel by joining the joining portions 117 of the both.

(2) The solar cell integral type roof panel is fastened to the sheathing roof board 122 by means of a clip 121.

(3) Subsequently, the procedure of steps (1) and (2) is repeated to install the roof panels.

(4) After the roofing up for one row all, the respective lead wires 115 are connected with the connectors 116.

(5) The procedure of (1) to (4) is further repeated on the rows of upper tiers. Thus, the roofing is all completed.

According to the present Example, it is unnecessary to provide the joint drip cap boards and joint covers which are necessary in the Preferred Embodiment. Thus, this has the effect of enabling the reduction of material cost and also making the roofing simple to enable the reduction of roofing cost. Also, in contrast to the flat shape of conventional lateral-roofed roofs, solar cell integral type roof panels very similar to clay tile patterns having spatial bulge can be installed, additionally bringing about the effect of ensuring the degree of freedom of design. Still also, since the joining portions in the lateral direction are provided at the tops of the curved portions 111, the ability to shut out rain that is the basic performance of roofing materials can be improved.

Example 2

Figure 13:
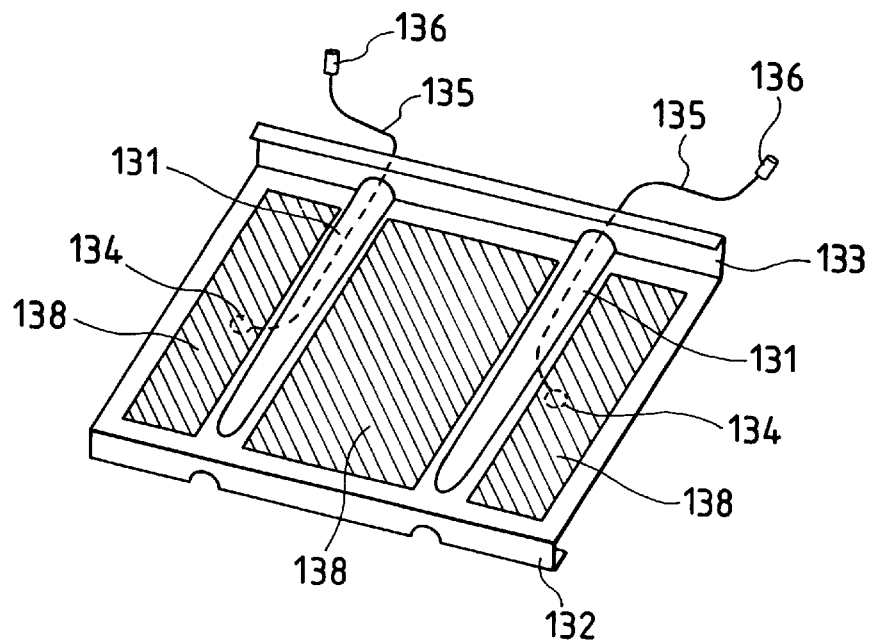
FIG. 13 is a diagrammatic perspective view of a solar cell integral type roof panel according to Example 2.

FIG. 13 illustrates a solar cell integral type roof panel according to the present Example.

The solar cell integral type roof panel in the present Example is constituted of an amorphous silicon photovoltaic device encapsulated with an encapsulation material onto a galvanized steel sheet, and is characterized by curved portions 131 provided in non-electricity-generation regions standing between solar cell blocks 138, which are different from those of the solar cell module shown in FIG. 8.

Amorphous silicon photovoltaic devices each having a stainless steel substrate were used as photovoltaic devices, and they were assembled in plurality in the same manner as in the Preferred Embodiment, to form photovoltaic device blocks 138.

Non-stretched type ETFE (ethylene-tetrafluorethylene copolymer; TEFZEL, trade name; available from Du Pont) was used as a surface cover film, EVA (ethylene-vinyl acetate copolymer) and glass fiber nonwoven fabric as fillers, and PET (polyethylene terephthalate) as a back cover film. These make up the photovoltaic device blocks 138 insulatingly encapsulated and bonded to the reinforcing sheet with the fillers (having the same basic constitution as the one shown in FIGS. 7A and 7B). Thus, a flat-shaped solar cell module was prepared.

As the reinforcing sheet, a known galvanized steel sheet (TAIMA COLOR GL, trade name; available from Daido Kohan K.K.) was used. The photovoltaic device blocks 138 were disposed with their distance made larger in part so that the curved portions 131 do not extend over the photovoltaic device areas.

Next, the flat-shaped solar cell module thus prepared was seam-bent by means of a roll forming machine to form an eaves-side joining portion 132 and a ridge-side joining portion 133. Thereafter, curved portions 131 for leading out lead wires were formed by pressing, at the non-electricity-generation regions standing between the photovoltaic device blocks 138, thus the module was formed into a roof panel.

Finally, lead wires 135 for taking out electric power were led out through holes 134 made in the steel sheet on the back at its curved portions 131 of the roof panel. The holes 134 were beforehand made in the reinforcing sheet, through which positive-pole and negative-pole lead wires 135 were led out. At the lead-out portions, junction boxes made of polycarbonate were provided for the purpose of insulation protection and water-proofing. At the ends of the lead wires 135, connectors 136 were attached.

The solar cell integral type roof panels according to the present Example can be installed on the roof in the same procedure as the Preferred Embodiment.

According to the present Example, it is not always required for the solar cell itself to have a flexibility, and hence a crystal type solar cell having a higher efficiency can be employed. Thus, this roof panel is worth being used at places having restrictions on the area of a roof. Also when a flexible solar cell is used, there is less possibility of applying an excess force to the solar cell at the time of bending. Hence, this brings about the effect of improving the yield of solar cell integral type roof panels. Also, there is less possibility of causing breaks or scratches in the encapsulation material positioned right above the solar cell. This is effective for improving reliability.

Example 3

Figure 14:
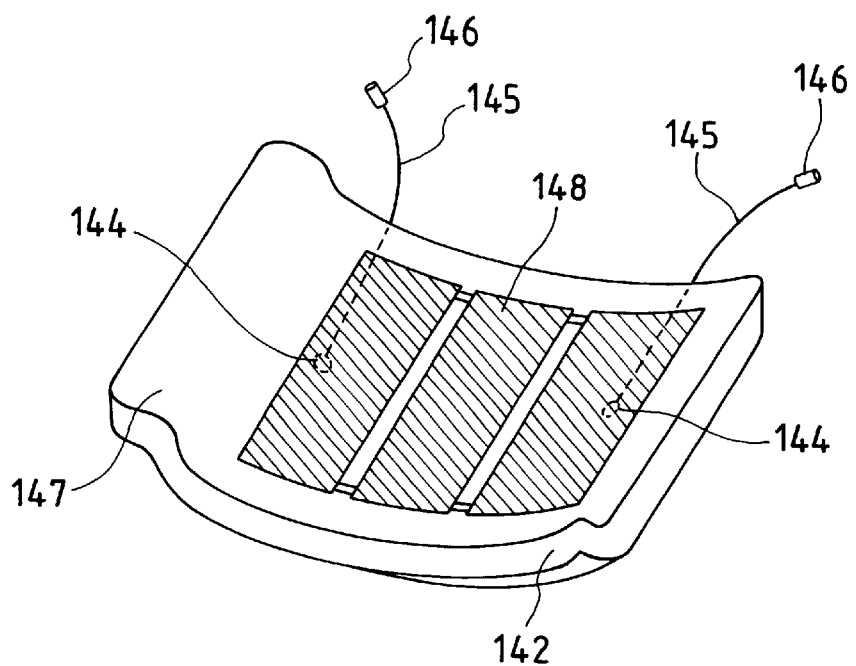
FIG. 14 is a diagrammatic perspective view of a solar cell integral type roof panel according to Example 3.

FIG. 14 illustrates a solar cell integral type roof panel according to the present Example.

The solar cell integral type roof panel in the present Example is constituted of an amorphous silicon photovoltaic device encapsulated with an encapsulation material onto a ceramic (reinforcing plate) beforehand molded in a bent form. More specifically, different from the solar cell integral type roof panel shown in the Preferred Embodiment, the reinforcing plate has no flexibility, the reinforcing plate has insulating properties and the reinforcing plate itself has a fairly large thickness.

The solar cell integral type roof panel according to the present Example will be described below in detail with reference to FIG. 14.

Amorphous silicon photovoltaic devices each having a stainless steel substrate were used as photovoltaic devices, and they were assembled in plurality in the same manner as in the Preferred Embodiment, to form photovoltaic device blocks 148.

Non-stretched type ETFE (ethylene-tetrafluorethylene copolymer; TEFZEL, trade name; available from Du Pont) was used as a surface cover film, and EVA (ethylene-vinyl acetate copolymer) and glass fiber nonwoven fabric were used as fillers. These make up the photovoltaic device blocks 148 insulatingly encapsulated by known vacuum lamination and bonded to the ceramic reinforcing plate with the encapsulation material.

As the ceramic reinforcing plate, a product was used which was obtained by firing clay or the like to solidify, using a mold in which a female corresponding an eaves-side joining portion 142 and a lateral-direction joining portion 147 had been formed. In the ceramic reinforcing plate molded in this way, a portion downward curved and extending to the lateral-direction joining portion 147 also functions as the curved portion for leading out the lead wire. In Examples 1 and 2, the lead wires are led out of the portion upward curved. In contrast, in the present example, the lead wires are led out of the space defined between the portion downward curved and the sheathing roof board.

In the ceramic reinforcing plate, lead wire fitting holes 144 were beforehand provided in downward curved portion excluding the joining portion 147 and the part where the bottom of the reinforcing plate came in contact with the underlying sheathing roof board. Utilizing the gaps left between the curved portion and the sheathing roof board, lead wires were led out through the holes 144 so that positive-pole and negative-pole output terminals were led out. Into the lead-out portions, a silicone resin type sealing medium was injected for the purpose of insulation protection and water-proofing. At the ends of the lead wires 145, connectors 146 were attached.

The solar cell integral type roof panels according to the present Example can be installed in the same procedure as that in Example 1.

According to the present Example, the solar cell integral type roof panel can be formed using a more inexpensive ceramic reinforcing plate. Also, since the ceramic reinforcing plate itself can ensure a thickness, it is unnecessary to provide the junction box. Still also, the ceramic reinforcing plate itself has insulating properties, the insulating film can be omitted. Moreover, the roofing can be performed by a method interchangeable with conventional clay tile roofing. Hence, this is effective for achieving cost reduction from both directions of material cost and roofing cost.

Example 4

Figure 15:
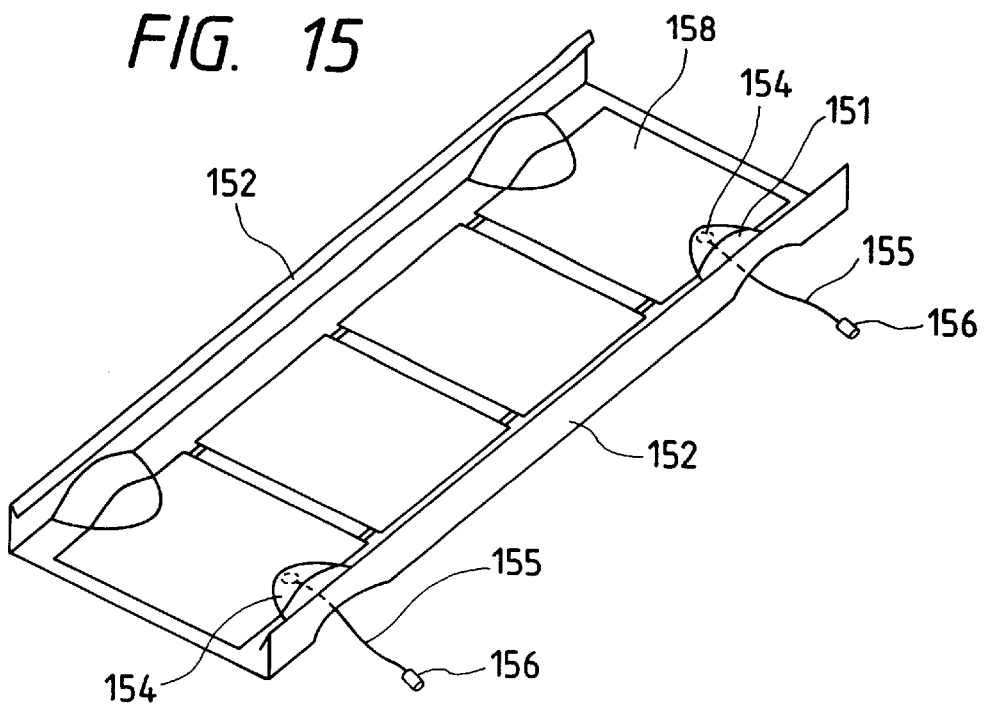
FIG. 15 is a diagrammatic perspective view of a solar cell integral type roof panel according to Example 4.

FIG. 15 illustrates a solar cell integral type roof panel according to the present Example.

The solar cell integral type roof panel in the present Example is constituted of an amorphous silicon photovoltaic device encapsulated with an encapsulation material onto a galvanized steel sheet, and is characterized by a roof panel for longitudinal roofing such as batten seam roofing, while the solar cell integral type roof panel shown in FIG. 8 is a lateral-roofing roof panel.

The solar cell integral type roof panel according to the present Example will be described below in detail with reference to FIG. 15.

Amorphous silicon photovoltaic devices each having a stainless steel substrate were used as photovoltaic devices, and they were assembled in plurality in the same manner as in the Preferred Embodiment, to form photovoltaic device blocks 158.

Non-stretched type ETFE (ethylene-tetrafluorethylene copolymer; TEFZEL, trade name; available from Du Pont) was used as a surface cover film, EVA (ethylene-vinyl acetate copolymer) and glass fiber nonwoven fabric as fillers, and PET (polyethylene terephthalate) as a back cover film. These make up the photovoltaic device blocks 158 insulatingly encapsulated and bonded to the reinforcing sheet with the fillers (having the same basic constitution as the one shown in FIGS. 7A and 7B).

As the reinforcing sheet, a known galvanized steel sheet (TAIMA COLOR GL, trade name; available from Daido Kohan K.K.) was used.

Next, joining portions 152 which function to join roofing materials in the flow direction (the longitudinal direction or the direction vertical to the ridge) were formed by means of a bending machine. Thereafter, curved portions 151 for leading out lead wires were formed by pressing. Thus, a roof panel was formed.

Finally, lead wires 155 for taking out electric power were led out through holes 154 made in the steel sheet on the back at its curved portions 151. In this way the lead wires can be directly led out on the back of the curved portions, thus the lead wires can be made shortest. The holes 154 were beforehand made in the reinforcing sheet, through which positive-pole and negative-pole lead wires 155 were led out. At the lead-out portions, junction boxes made of polycarbonate were provided for the purpose of insulation protection and water-proofing. At the ends of the lead wires 155, connectors 156 were attached.

Figure 16:
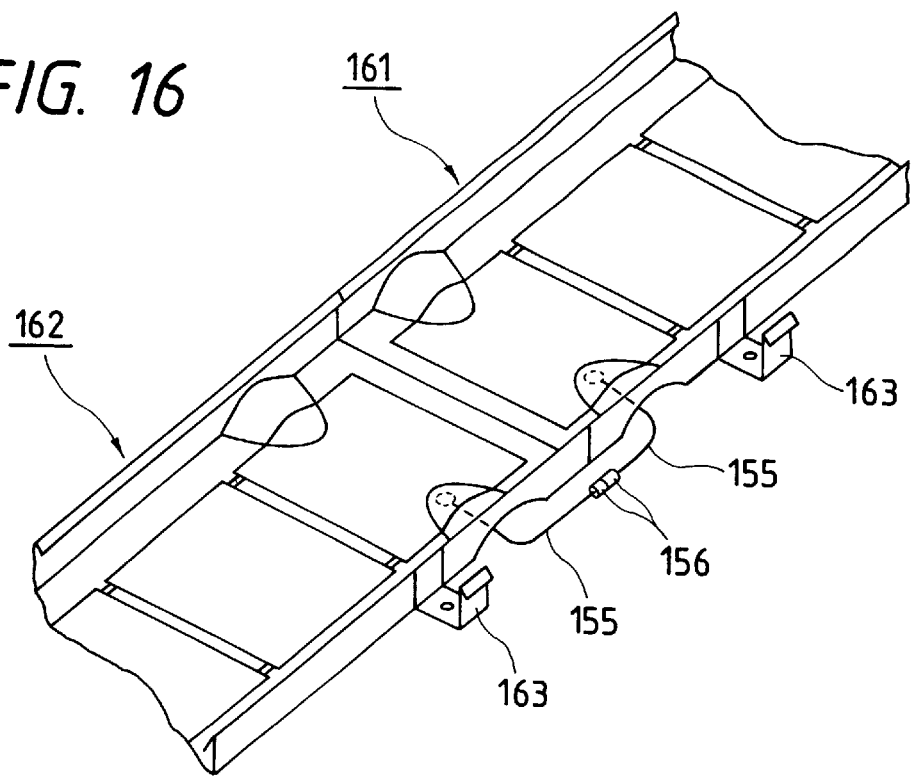
FIG. 16 is a diagrammatic perspective view to illustrate a procedure for installing the solar cell integral type roof panel in Example 4.

The roof panels according to the present Example can be installed on the roof in the same procedure as the conventional batten seam roofing roof panels. Besides, with regard to operations for lead-wire connection, wires of an upper panel 161 and a lower panel 162 can be connected as shown in FIG. 16. Thus, the operations for lead-wire connection can be made simple like the Preferred Embodiment and also the degree of freedom of wiring can be ensured. Also, the roof panels can be fastened to the roof base by means of clips 163.

The present Example realizes a solar cell integral type roof panel that can be used in roof panels of longitudinal roofing having a rain shut-out performance superior to lateral roofing, thus the roofing for their installation can be made simple. Since the longitudinal roofing can be commonly operated more easily than the lateral roofing, solar cell integral type roof panels promising a lower roofing cost can be realized.

As described above, according to the present invention, the lead wires can be freely connected within the space between the solar cell integral type roof panel and the roof base, and hence it becomes possible to set up a solar cell electricity generation system having a superior reliability not only from a mechanical viewpoint but also from an electrical viewpoint. Also, since the troublesome operations concerning the wiring can be made simple, the roofing cost of solar cell integral type roof panels can be reduced. Any mistakes in roofing that may be made because of troublesome wiring operations can also be prevented.

What is claimed is:

1. A solar roof member comprising a photovoltaic device encapsulated with an insulating material onto a reinforcing member,
   wherein the reinforcing member has a joining portion at which an adjoining solar roof member is joined, and a curved portion through which a lead wire is led out and which is so provided in the reinforcing member as to extend over at least part of the joining portion having a raised shape.

2. A solar roof member comprising a photovoltaic device encapsulated with an insulating material onto a reinforcing member,
   wherein the reinforcing member has a joining portion at which an adjoining solar roof member is joined, and a curved portion through which a lead wire is led out and which is so provided in the reinforcing member as to extend over at least part of the joining portion; and
   wherein the photovoltaic device is encapsulated with the insulating material also at the curved portion having a raised shape.

3. A solar roof member comprising a photovoltaic device encapsulated with an insulating material onto a reinforcing member,
   wherein the reinforcing member has a joining portion at which an adjoining solar roof member is joined, and a curved portion through which a lead wire is led out and which is so provided in the reinforcing member as to extend over at least part of the joining portion; and
   wherein the photovoltaic device comprises a flexible photovoltaic device that is encapsulated with the insulating material also at a curved portion having a raised shape.

4. The solar roof member according to claim 1, wherein the reinforcing member comprises a metal sheet having a flexibility.

5. The solar roof member according to claim 1, wherein the reinforcing member has a lead-wire lead-out portion, and a lead wire of the photovoltaic device is led out through the lead-wire lead-out portion.

6. The solar roof member according to claim 5, wherein the lead-wire lead-out portion is provided at the curved portion.

7. The solar roof member according to claim 5, wherein the lead-wire lead-out portion is provided at a flat area in the vicinity of the curved portion.

8. The solar roof member according to claim 5, wherein the lead-wire lead-out portion is provided at a flat area in the vicinity of the joining portion.

9. A process for manufacturing a solar roof member, comprising the steps of:

encapsulating a photovoltaic device with an insulating material onto a reinforcing member;

bending at least part of the reinforcing member to form a joining portion for joining a solar roof member; and forming in the reinforcing member a curved portion so formed as to extend over at least part of the joining portion.

10. The process according to claim 9, wherein the reinforcing member comprises a metal sheet having a flexibility.

11. The process according to claim 10, wherein the step of forming the joining portion is carried out using a bending machine, a pressing machine or a roll forming machine.

12. The process according to claim 10, wherein the step of forming the curved portion is carried out using a pressing machine.

13. A solar roof member comprising a photovoltaic device encapsulated with an insulating material onto a reinforcing member, wherein;

the reinforcing member has a joining portion capable of preventing rain from entering at which end an adjoining solar roof member is joined, and a curved portion through which a lead wire is led out and which is so provided in the reinforcing member as to extend over at least part of the joining portion having a raised shape.

14. A process for manufacturing a solar roof member, comprising the steps of:

encapsulating a photovoltaic device with an insulating material onto a reinforcing member;

bending at least part of the reinforcing member to form a joining portion capable of preventing rain from entering and for joining a solar roof member; and forming in the reinforcing member a curved portion so formed as to extend over at least part of the joining portion.

15. A roofing method for installing a solar roof member, comprising the steps of:

installing a solar roof member having a photovoltaic device encapsulated with an insulating material onto a reinforcing member, wherein the reinforcing member has a joining portion at which an adjoining solar roof member is joined, and a curved portion provided in the reinforcing member as to extend over at least part of the joining portion having a raised shape; and leading out a lead wire through the curved portion of the reinforcing member of the solar roof member to a roof base member on which an adjoining solar roof member has not yet been installed.

16. The roofing method according to claim 15, wherein the lead wire is connected with another lead wire in a space defined between the roof member and the roof base member.

17. A roofing method for installing a row of solar roof members, comprising the steps of:

installing the row of solar roof members, each solar roof member having a photovoltaic device encapsulated with an insulating material onto a reinforcing member, wherein the reinforcing member has a joining portion at which an adjoining solar roof member is joined, and a curved portion provided in the reinforcing member that extends over at least part of the joining portion having a raised shape; and connecting lead wires between the solar roof members after the row of solar roof members has been installed.

18. The roofing method according to claim 17, wherein the reinforcing member is a reinforcing board.

\* \* \* \* \*

UNITED STATES PATENT AND TRADEMARK OFFICE
CERTIFICATE OF CORRECTION

PATENT NO. : 6,311,436 B1
DATED : November 6, 2001
INVENTOR(S) : Toshihiko Mimura et al.

It is certified that error appears in the above-identified patent and that said Letters Patent is hereby corrected as shown below:

Column 1,
Line 20, "(boad roofing)" should read -- (board roofing) --; and
Line 56, "can not" should read -- cannot --.

Column 2,
Line 32, "they can not" should read -- that cannot --;
Line 42, "in less compliancy" should read -- more independent of the wiring --; and
Line 44, "can not" should read -- cannot --.

Column 6,
Line 37, "can not" should read -- cannot --.

Column 17,
Line 29, "wherein;" should read -- wherein --.

Signed and Sealed this

Tenth Day of September, 2002

Attest:

Attesting Officer

JAMES E. ROGAN
Director of the United States Patent and Trademark Office